United States Patent [19]

Tan

[11] Patent Number: 4,868,829

[45] Date of Patent: Sep. 19, 1989

[54] APPARATUS USEFUL FOR CORRECTION OF SINGLE BIT ERRORS IN THE TRANSMISSION OF DATA

[75] Inventor: Charles M. C. Tan, Campbell, Calif.

[73] Assignee: Hewlett-Packard Company, Palo Alto, Calif.

[21] Appl. No.: 102,519

[22] Filed: Sep. 29, 1987

[51] Int. Cl.$^4$ ............................................. G06F 11/10
[52] U.S. Cl. .................................................. 371/37.2
[58] Field of Search ............................................. 371/37

[56] References Cited

U.S. PATENT DOCUMENTS

| | | | |
|---|---|---|---|
| 3,601,798 | 8/1971 | Hsiao | 371/37 |
| 3,648,239 | 3/1972 | Carter et al. | 371/38 |
| 3,825,893 | 7/1974 | Bossen et al. | 371/38 |
| 4,450,561 | 5/1984 | Götze et al. | 371/37 |

OTHER PUBLICATIONS

IBM Technical Disclosure Bulletin, Dobrzynski, "Optimum and Symmetrical Error Correction Code", vol. 13, No. 10, Mar. 1971, p. 2829.
IBM Technical Disclosure Bulletin, Glick et al., "Single-Error Correction, Double-Error Detection Code . . .", vol. 15, No. 1, Jun. 1972, pp. 130–134.

*Primary Examiner*—Jerry Smith
*Assistant Examiner*—Stephen M. Baker
*Attorney, Agent, or Firm*—Alan H. Haggard

[57] ABSTRACT

An apparatus which corrects single bit errors and detects double bit errors including an encoder/decoder. During encoding the encoder/decoder produces a plurality of parity bits. These parity bits allow the correction of single bit errors in transmission. The encoder/decoder includes a plurality of arrays. Each array consists of logic gates arranged in the form of a binary tree. When the encoder/decoder is used in decoding, the encoder/decoder produces a plurality of syndrome bits. These syndrome bits are used to correct single bit errors in transmission. Error correction circuitry composed of logic gates receive the syndrome bits and generate flipper bits used in error correction. When a first data bit for which a first flipper bit is being generated is used in the production of a majority of syndrome bits, a logic gate which generates the first flipper bit receives as input only syndrome bits in the production of which the first data bit was used. When a second data bit for which a second flipper bit is being generated was not used in the production of a majority of syndrome bits, a logic gate which generates the second flipper bit receives as input only syndrome bits for the production of which the second data bit was not used.

6 Claims, 10 Drawing Sheets

TABLE 1

```
                                                                    ┐─1
                                                                    ├─2
       BBBBBBBBCBBBBBBBBBBBBBBBBBBBBBBBBBBCBBBBCCCC                  ┘─3
       6666555 555555554444444444333333333322222 2222221111111 1000000 000 0
       3210987765432109876543210987654321098765432109876543210987654321302 10
    4 ┌ 72 ─ 1111111111111111111111111111111111111111111111111111 P0
    5 ┌ 36 ─ 1010101010101010101010101010101010101010101010101010 P1
    6 ┌ 36 ─ 1100110011001100110011001100110011001100110011001100 P2
    7 ┌ 36 ─ 1111000011110000111100001111000011110000111100001111 0000 P3
    8 ┌ 32 ─ 0000000011111111000000001111111100000000111111110000 0000 P4
    9 ┌ 32 ─ 0000000000000000111111111111111100000000000000001111 1111 P5
   10 ┌ 32 ─ 0000000000000000000000000000000011111111111111111111 1111 P6    ┐
   11 ┌ 08 ─ 1111111100000000000000000000000000000000000000000000 0000 P7    ├─13
   14 ─ 5443332766554554544365544354433265544343324332323221            ─12
```

TABLE 2

```
                                    BBBBBBBBBBBBBBBBBBBBBBBBBBBBBBBB CCCCCCCC      ←1001 ←1002 ←1003
                                    66665555555555444444444333333333222222221111111100000000 76543210
                                    32109876543210987654321098765432109876543210987654321098 76543210
1020 ──── 31 ── 10010110011001011001010101010101010101010101010101101000 00000001  P0
1021 ──── 31 ── 01100110011001100110010101010101010101010101010101010001 00000010  P1
1022 ──── 31 ── 01011001100110011001010101010101010101010101010101000101 00000100  P2  ⎫
1023 ──── 31 ── 10101010010101010101010101010101010110100101010110000010 00001000  P3  ⎬ 1013
1024 ──── 31 ── 10101010010101010101010101010101010110010010101010000100 00010000  P4  ⎭
1025 ──── 31 ── 01010101100110011001100110011001100101100101010101001010 00100000  P5
1026 ──── 31 ── 01010101100110011001100110011001100101010010101010010100 01000000  P6
1027 ──── 31 ── 01010101010101010101010101010101010000010101010110010100 10000000  P7
1014 ──── 35353535353535353535353535353535353535353535353535353333 11111111
     1012
```

FIG 10

APPARATUS USEFUL FOR CORRECTION OF SINGLE BIT ERRORS IN THE TRANSMISSION OF DATA

BACKGROUND

Whenever information is transferred across a bus or other communication lines, there is the possibility that data may be corrupted. Therefore it is desirable to detect and even correct errors that occur in transmission. In the prior art, Hamming codes are used to correct single bit errors in transmission. This is done by the utilization of parity bits. For a general discussion on the use of parity bits and Hamming codes see Richard E. Blahut, *Theory and Practice of Error Control Codes*, Edison Wesley, 1983, pp. 11-12, 54-55.

Under the traditional method, for every "n" bits of data, there are required "m" Hamming parity bits. The formula for calculating m is the following:

$$m = \ln_2(n) + 1$$

In addition to single bit error correction, double bit error detection may be achieved by adding a sngle overall parity bit. Therefore, for one-bit error correction and two-bit error detection m+1 parity bits need to be used for every n data bits.

For example, if data is being transferred in sixty-four bit words, for every sixty-four (n) bit words of data, seven (m) parity bits must be added in order to correct one-bit errors. m is calculated from the above formula. In order to detect two-bit errors an eighth parity bit must be added.

Figure 1:
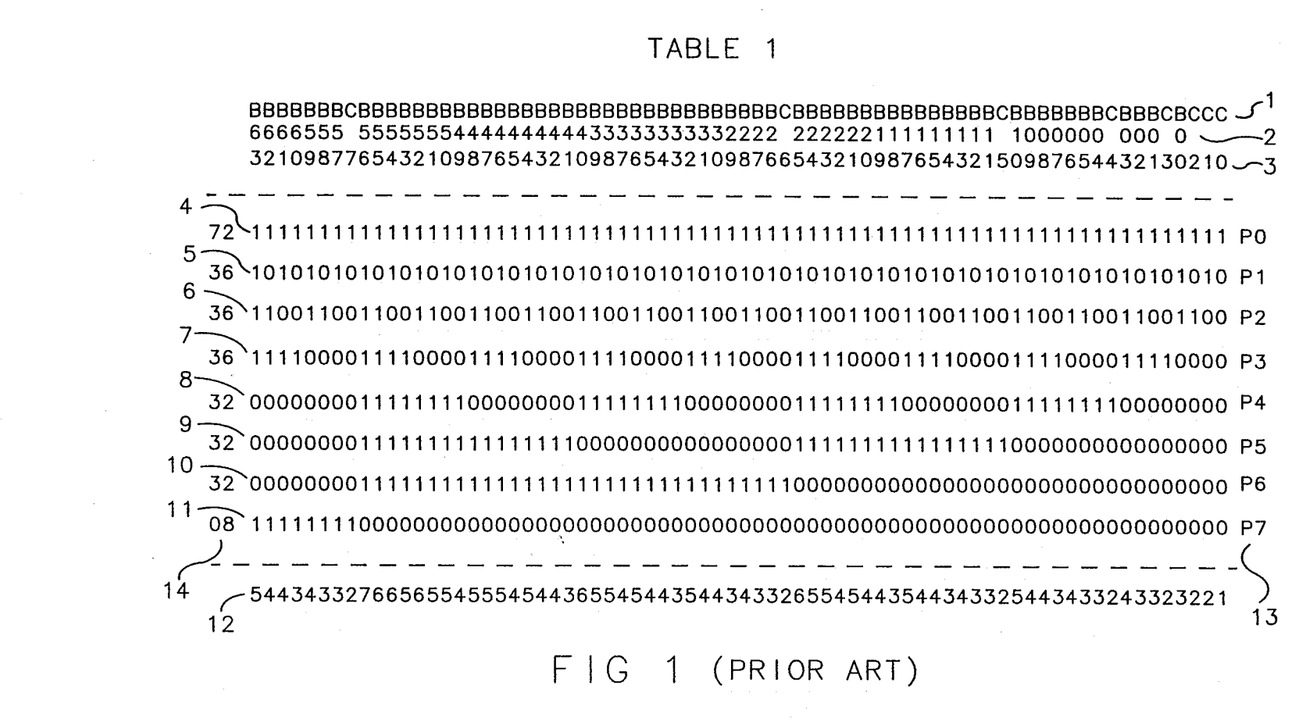
FIG. 1 shows a hamming matrix which illustrates the implementation of a traditional hamming algorithm.

Table 1, in FIG. 1, is used to illustrate the implementation of a traditional hamming algorithm. In this implementation, sixty-four bits of information and eight parity bits are used. Each column in Table 1 represents a single line on which is placed a single data bit or a single parity bit. Parity bits are sometimes referred to as code bits, as explained further below.

Row 1 contains letters designating whether each line contains a data bit or a parity bit. If the letter is a "B", the line contains a data bit. If the letter is a "C", the line contains a parity bit. Row 2 and Row 3 number the lines. The parity bits are numbered from 0 to 7. The data bits are numbered from 0 to 63. The parity bits are referred to as C0-C7. The data bits are referred to as B0-B63.

As will be explained in greater detail in the Description of the Preferred Embodiment below, lines containing the data bits and the parity bits are coupled into logic circuitry to generate bits P0-P7, shown in column 13. Bits P0-P7 may be code bits or syndrome bits, as further described below. In this discussion, bits P0-P7 will be assumed to be syndrome bits.

Syndrome bits P0-P7 are used to detect and correct errors. The information in Rows 4-11 show which data bits and which parity bits are used to calculate each of the syndrome bits P0-P7. A "1" in the row indicates that a data bit or parity bit is used to calculate the corresponding syndrome bit in Column 13. A "0" in the row indicates that a data bit or parity bit is not used to calculate the corresponding syndrome bit in column 13. For instance, all eight parity bits and all sixty-four data bits are used to generate syndrome bit P0. On the other hand only parity bit C7 and data bits B57, B58, B59, B60, B61, B62 and B63 are used to generate syndrome bit P7.

Column 14 shows the total number of data bits and parity bits to generate each syndrome bit P0-P7. As can be seem, 72 parity bits and data bits are used to generate syndrome bit P0. 36 parity bits and data bits are used to generate syndrome bit P1. 36 parity bits and data bits are used to generate syndrome bit P2. 36 parity bits and data bits are used to generate syndrome bit P3. 32 parity bits and data bits are used to generate syndrome bit P4. 32 parity bits and data bits are used to generate syndrome bit P5. 32 parity bits and data bits are used to generate syndrome bit P6. 8 parity bits and data bits are used to generate syndrome bit P7.

Row 12 shows how many times each parity bit C0-C7 and each data bit B0-B63 is used to calculate one of the syndrome bits P0-P7. As can be seen, the values range from 1 to 7. That is parity bit C0 is used in the calculation of only one syndrome bit—syndrome bit P0—, while data bit B56 is used in the calculation of seven syndrome bits—all but syndrome bit P7—.

The time required to generate each syndrome bit is relative to the number of data bits B0-B63 and parity bits C0-C7 used to generate that syndrome bit. This is because, the larger the number of inputs, the more levels of logic must be utilized to generate an output.

Syndrome bit P0 is used as an overall parity bit. In the prior art an overall parity bit has been required for double error detection. 72 data and parity bits are required to generate syndrome bit P0; therefore, in the prior art, in order to perform double error detection, the critical path has been the determination of the overall parity bit, requiring at least one more layer of logic than is required to calculate any of the other syndrome bits P1-P7. In order to avoid the additional delay, some prior art system, do not have an overall parity bit. That is, in the embodiment shown in FIG. 1, syndrome bit P0 would be omitted and double error detection would not be performed.

Similarly, the number of times each parity bit C0-C7 and each data bit B0-B63 is used to calculate one of the syndrome bits P0-P7 has a notable effect on performance. This is because each input of the circuitry which generates syndrome bits P0-P7 has a certain amount of capacitance that must be overcome. If a single parity bit or a single data bit issued in the generation of many syndrome bits additional time has to be allowed for the overcoming of the input capacitance.

As may be understood from the preceding discussion, the prior art implementations of hamming algorithms for error correction and detection have not been optimal. The wide variance in the total number of data and parity bits to generate each syndrome bit, and the varying number of times each parity bit and data bit are used to generate a syndrome bit have degraded the performance of these prior art systems. It is an objective of the present invention to present an apparatus which overcome the stated defects of the prior art systems.

SUMMARY OF THE INVENTION

In accordance with the preferred embodiment of the present invention an apparatus which corrects single bit errors and detects double bit errors is presented. The present invention includes an encoder/decoder. During encoding the encoder/decoder produces a plurality of parity bits. These parity bits allow the correction of single bit errors in transmission and the detection of double bit errors in transmission. The encoder/decoder comprises a plurality of arrays. Each array consists of logic gates arranged in the form of a binary tree. Each array generates a single parity bit. Further every array receives as input the same number of data bits; however, each array receives a unique combination of data bits. This is an improvement over the prior art. In the prior art, designers did not use equal number of data bits as input to each array. This is especially notable in the generation of overall parity bits in the prior art. In the generation of an overall parity bit all the data bits were used, not just a subset of the data bits.

When the encoder/decoder is used in decoding, the encoder/decoder produces a plurality of syndrome bits. These symdrome bits are used to correct single bit errors in transmission and to detect double bit errors in transmission. When decoding, each array of logic gates within the encoder/decoder produces a single syndrome bit. Each array has as input data bits, as when it is encoding. Additionally each array receives as input one and only one parity bit. The receipt of one and only one parity bit by each array allows for the encoder/decoder to be used both for encoding and decoding. This allows a great reduction in hardware required to implement error correction and detection. In the prior art, syndrome bits are generally produced using more than one parity bit. For instance, every parity bit is used in generating the syndrome bit which checks overall parity (P0). As discussed above, when more than one parity bit is used by an array to produce a syndrome bit, different hardware is required for encoding and decoding. Thus the present invention is a significant improvement over the prior art.

BRIEF DESCRIPTION OF THE DRAWINGS

FIG. 5A shows data flow when data is encoded in accordance with the preferred embodiment of the present invention. FIG. 5B shows data flow when data is decoded in accordance with the preferred embodiment of the present invention.

DESCRIPTION OF THE PREFERRED EMBODIMENT

Figure 2:
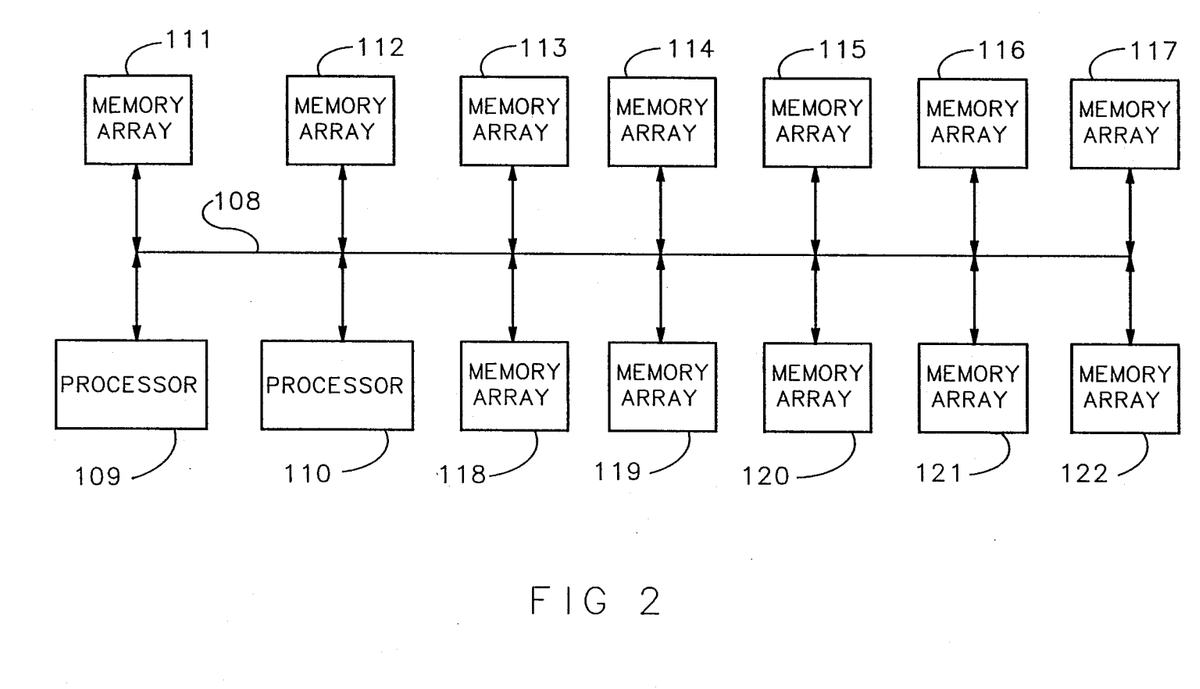
FIG. 2 shows a plurality of memory arrays and two processors coupled to a memory bus.

FIG. 2 shows a memory bus 108. Coupled to memory bus 108 is a memory array 111, a memory array 112, a memory array 113, a memory array 114, a memory array 115, a memory array 116, a memory array 117, a memory array 118, a memory array 119, a memory array 120, a memory array 121, a memory array 122, a processor 109 and a processor 110. Processors 109 and 110 access information in memory arrays 111–122, through memory bus 108. In order to verify the integrity of data transmitted across data bus 108, the data is encoded before transmission across bus 108, and decoded upon receipt. In the preferred embodiment of the present invention data is organized into sixty-four bit words. After encoding, each sixty-four bit words is accompanied by additional eight code bits when transmitted across bus 108, as further described below.

Figure 3A:
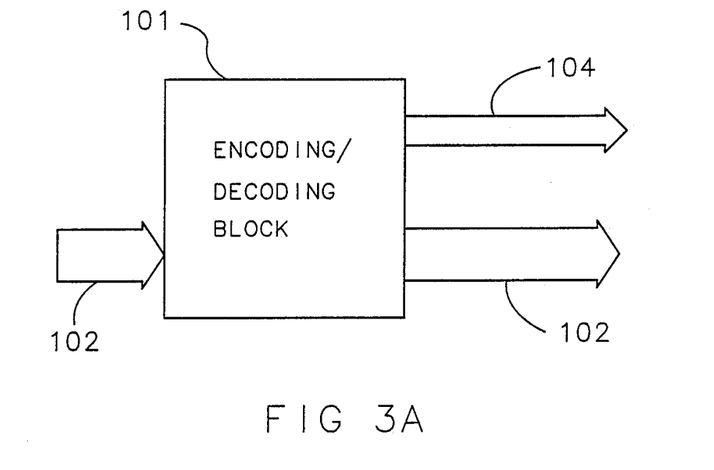
FIG. 3A is a block diagram which shows data flow when data is encoded in accordance with the preferred embodiment of the present invention.

FIG. 3A shows an encoding/decoding block 101. Each processor 109 and 110 and each memory array 111–122 has an encoding/decoding block identical to encoding/decoding block 101. In FIG. 3A encoding/decoding block 101 is configured to encode data. Sixty-four data bits 102, enter encoding/decoding block 101. Exiting encoding/decoding block 101 are data bits 102, which are unchanged, and eight code bits 104. Data bits 102 and code bits 104 are transmitted together across bus 108. The addition of code bits 104 allows for correction of a single error in transmission of data bits 102 and for detection of two errors in transmission of data bits 102 and code bits 104.

Figure 3B:
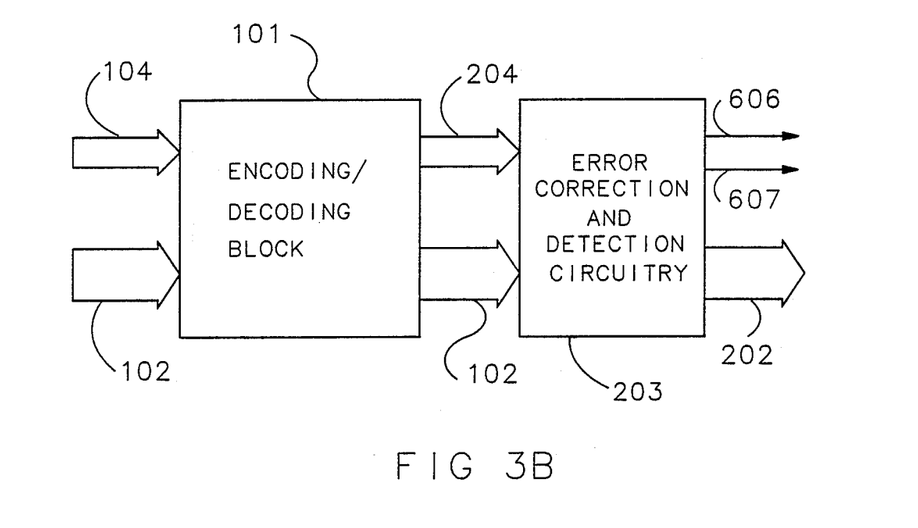
FIG. 3B is a block diagram which shows data flow when data is decoded in accordance with the preferred embodiment of the present invention.

FIG. 3B shows encoding/decoding block 101 configured for decoding data. Upon reception of a transmission across bus 108 encoding/decoding block 101 receives sixty-four data bits 102 and eight code bits 104. Data bits 102 and code bits 104 may have been corrupted by transmission through bus 108. Exiting encoding/decoding block 101 are sixty-four data bits 102, which encoding/decoding block 101 does not alter, and eight syndrome bits 204. Syndrome bits 204 are used by error correction and detection circuitry 203. Error correction and detection circuitry 203 receives syndrome bits 204 and uncorrected data bits 102. Error correction and detection circuitry 203 produces sixty-four corrected data bits 202, a multiple bit error signal 606 and an error signal 607.

If there is no error in transmission, error signal 607 wil be at logic 1. If there is an error in transmission, error signal 607 will be at logic 0. If there is no error in transmission, or two errors in transmission, multiple bit error signal 606 will be at logic 1. If there is a single error in transmission, error signal 607 will be at logic 0. If error signal 607 is at logic 0 and multiple bit error signal 606 is at logic 1, it is assumed that there were two errors in transmission.

If error correction and detection circuitry 203 detects no error in transmission, data bits 202 are identical to data bits 102. If error correction and detection circuitry 203 detects a single error in transmission, data bits 202 differ from data bits 102 in the bit in which the error occurred. The uncorrupted bits of data bits 102 will be identical with the corresponding bits of data bits 202. If error correction and detection circuitry 203 detects two errors in transmission, data bits 202 are thrown away and retransmission is required.

Figure 4:
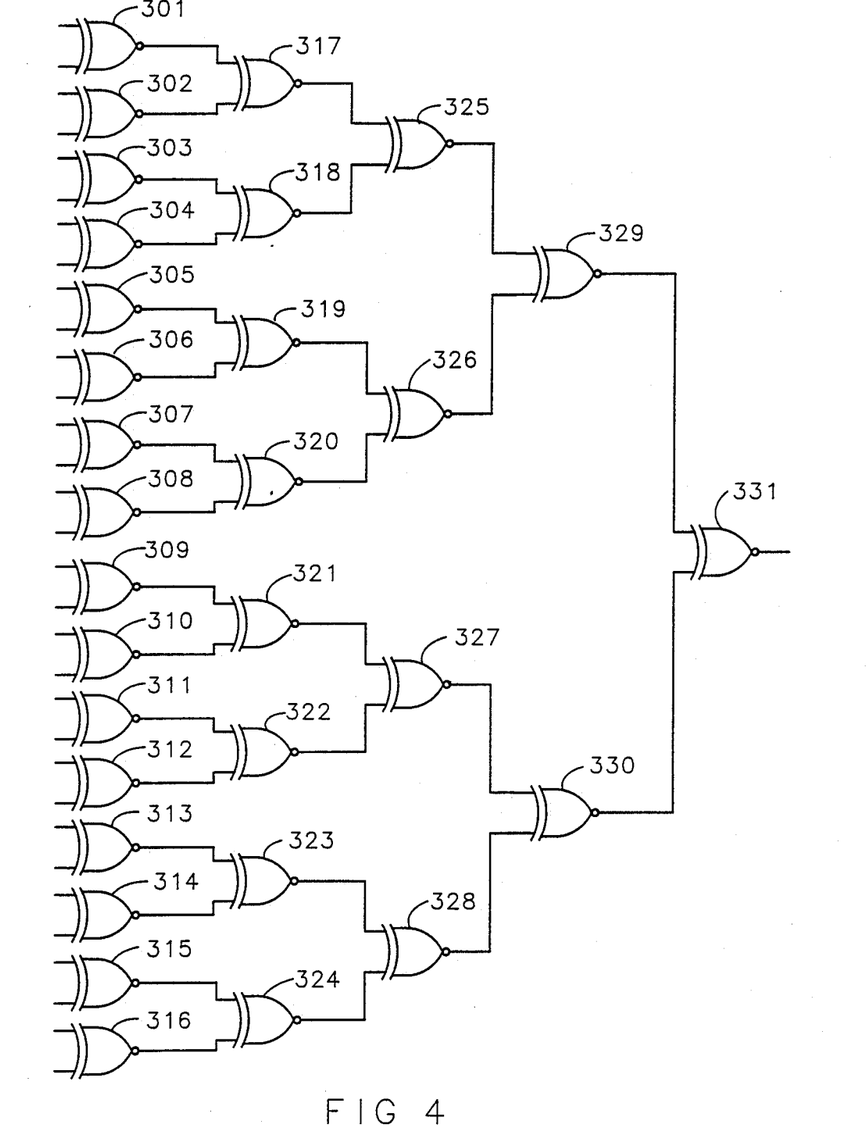
FIG. 4 shows details of an Encoding/Decoding Block shown in FIGS. 3A and 3B in accordance with the preferred embodiment of the present invention.

FIG. 4 shows an array of Exclusive-Nor gates 301–331 coupled together in a binary tree structure. The binary tree structure of Exclusive-Nor gates is referred to herein as an XNOR array. The XNOR array shown in FIG. 4 has thirty-two inputs and one output.

Figure 5A:
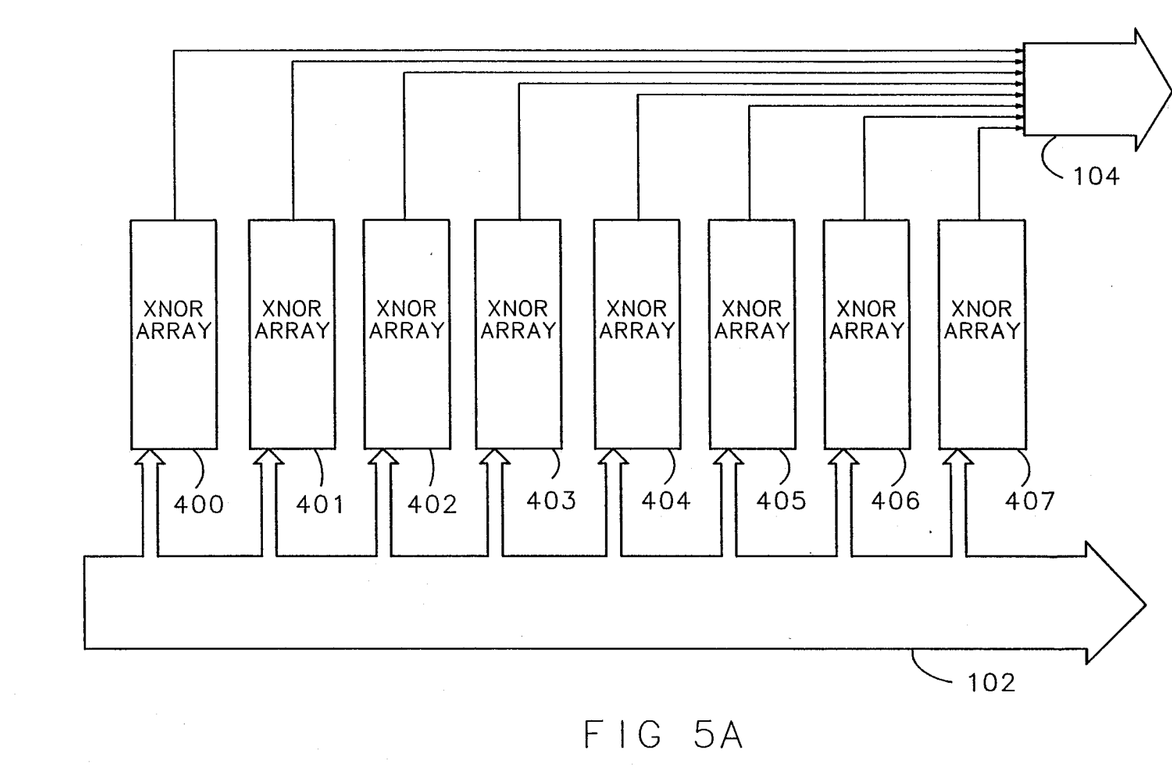
FIGS. 5A and 5B show additional details of the Encoding/Decoding Block shown in FIGS. 3A and 3B.

FIG. 5A shows details of Encoding/Decoding Block 101 shown in FIGS. 3A and 3B. FIG. 5A shows data flow when data is encoded in preparation for transmission across bus 108. A subset of data bits 102 serves as input to an XNOR array 400, an XNOR array 401, an XNOR array 402, an XNOR array 403, an XNOR array 404, an XNOR array 405, an XNOR array 406 and an XNOR array 407. Each of XNOR arrays 400-407 receives thirty of sixty-four data bits from data bits 102. However, no two XNOR array from XNOR arrays 400-407 receive exactly the same thirty data bits. The means for selecting which data bits a particular XNOR array receives is discussed later in the explanation of Table 2 in FIG. 11.

XNOR arrays 400-407 are identical to the XNOR array shown in FIG. 4. When XNOR arrays 400-407 are configured as shown in FIG. 5A, only thirty of thirty-two inputs of each of XNOR arrays 400-407 are utilized. The other two inputs are set at logic 0.

Each of XNOR arrays 400-407 produces a single output. These outputs from XNOR arrays 400-407 are the eight code bits 104.

Figure 5B:
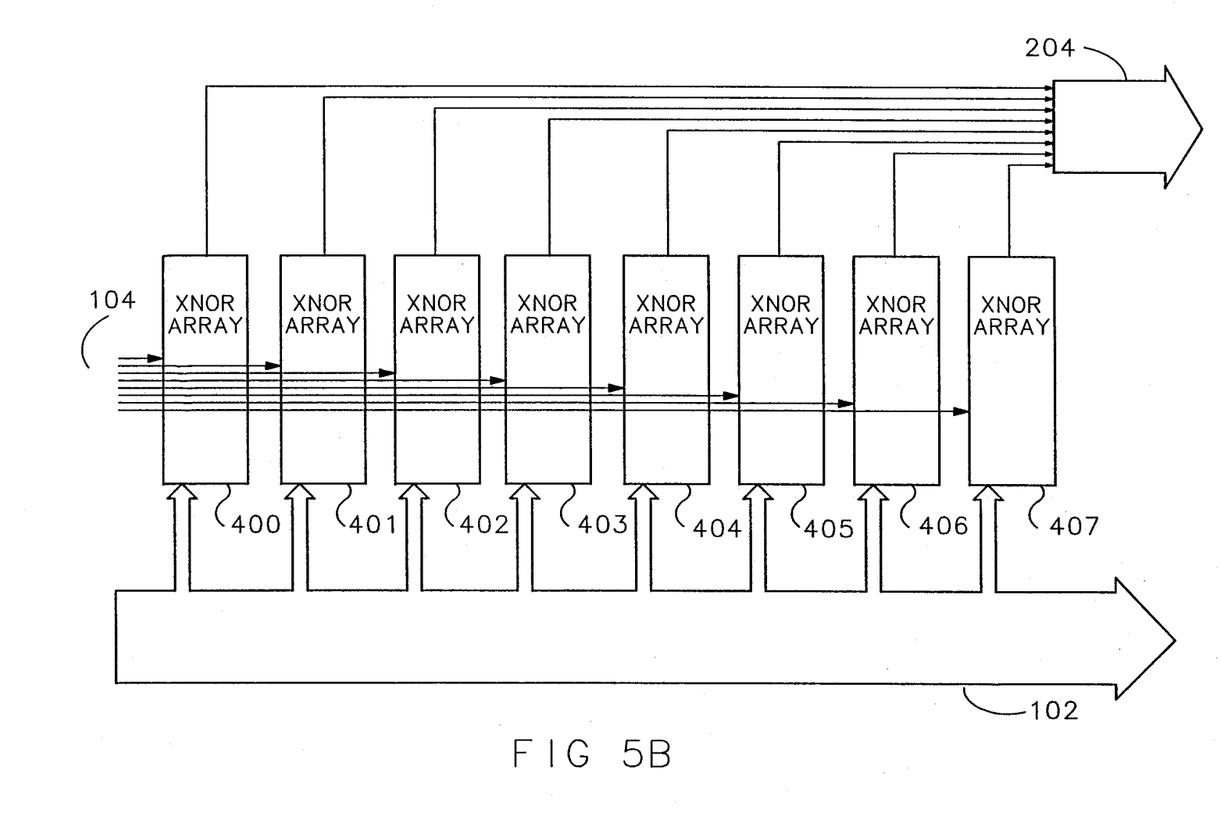

FIG. 5B similarly shows details of Encoding/Decoding Block 101 shown in FIGS. 3A and 3B. FIG. 5B shows data flow when data is decoded after a transmission is received from bus 108. A subset of data bits 102 serves as input to XNOR array 400, XNOR array 401, XNOR array 402, XNOR array 403, XNOR array 404, XNOR array 405, XNOR array 406, and XNOR array 407. Each of XNOR arrays 400-407 receives thirty of sixty-four data bits from data bits 102. However, no two XNOR array from XNOR arrays 400-407 receive exactly the same thirty data bits. Additionally, each of XNOR arrays 400-407 receives a code bit from code bits 104. The means for selecting which data bits from data bits 102, and which code bits from code bits 104 a particular XNOR array receives is discussed later in the explanation of Table 2 in FIG. 11.

When XNOR arrays 400-407 are configured as shown in FIG. 5A, only thirty-one of thirty-two inputs of each of XNOR arrays 400-407 are utilized. The final input is set at logic 0. In the preferred embodiment of the present invention the final input of each of XNOR arrays 400-407 is not utilized in normal operation. These may be used for diagnostic purposes to verify correct function of the system circuitry.

Each of XNOR arrays 400-407 produces a single output. These outputs from XNOR arrays 400-407 are the eight syndrome bits 204.

Figure 6:
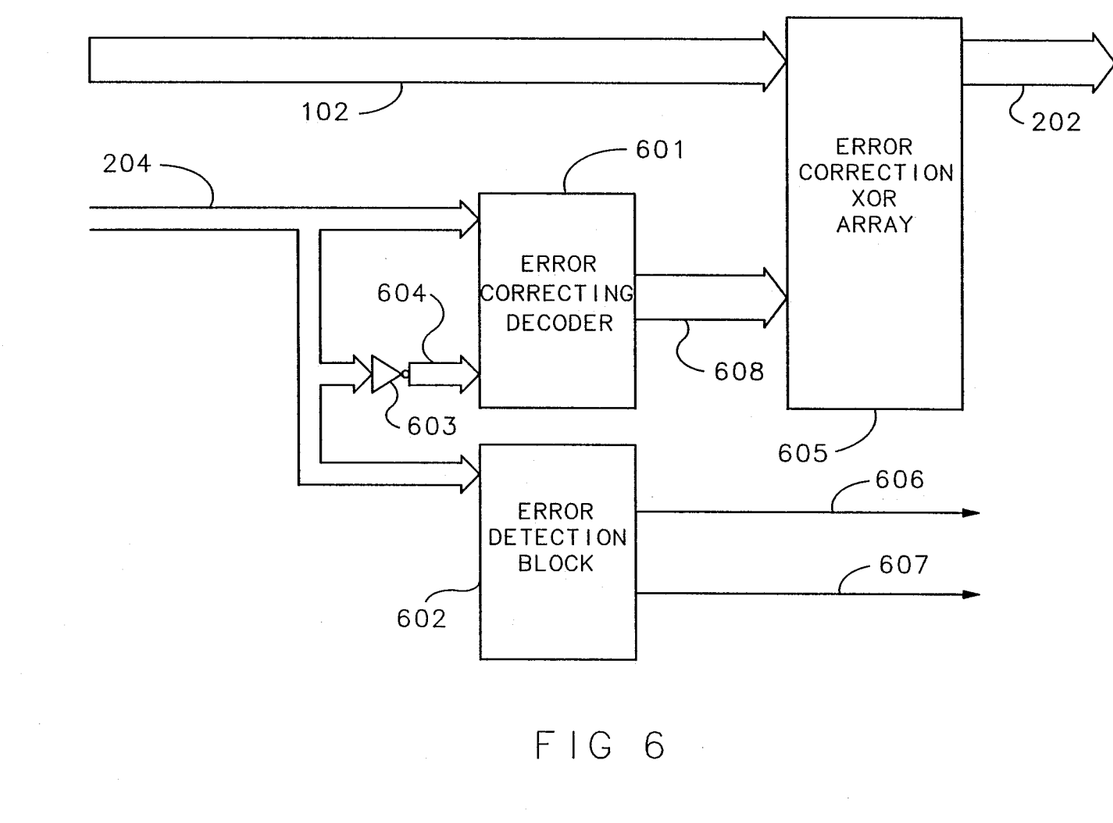
FIG. 6 is a block diagram showing data flow in error correction and detection circuitry shown in FIG. 3B in accordance with the preferred embodiment of the present invention.

FIG. 6 is a more detailed block diagram of error correction and detection circuitry 203 shown in in FIG. 3B. Syndrome bits 204 enter an error correcting decoder 601 and an error detection block 602. Additionally the complement of each of syndrome bits 204 is produced by placing syndrome bits 204 through inverter 603 to produce complemented syndrome bits 604. Complemented syndrome bits 604 also serve as input to error correcting decoder 601. Error correcting decoder 601 produces sixty-four flipper control bits 608.

Each of flipper control bits 608 corresponds to a data bit of data bits 102. When there is a single error in transmission across bus 108, flipper control bits will indicate in which bit there is an error. When there is no detected error in transmission each of flipper control bits 608 will be at logic 0. When there is a single bit error, for the bit of data bits 102 in which the single error occurs, the corresponding flipper control bit from flipper control bits 608 will be at logic 1.

An error correction array of "Exclusive-Or" gates (XOR array) 605 receives flipper conrol bits 608 and data bits 102. Error correction XOR array 605 combines data bits 102 and flipper control bits 608 to produce corrected data bits 202.

Error detection block 602 receives syndrome bits 204 and produces multiple bit error signal 606 and error signal 607.

Figure 7A:
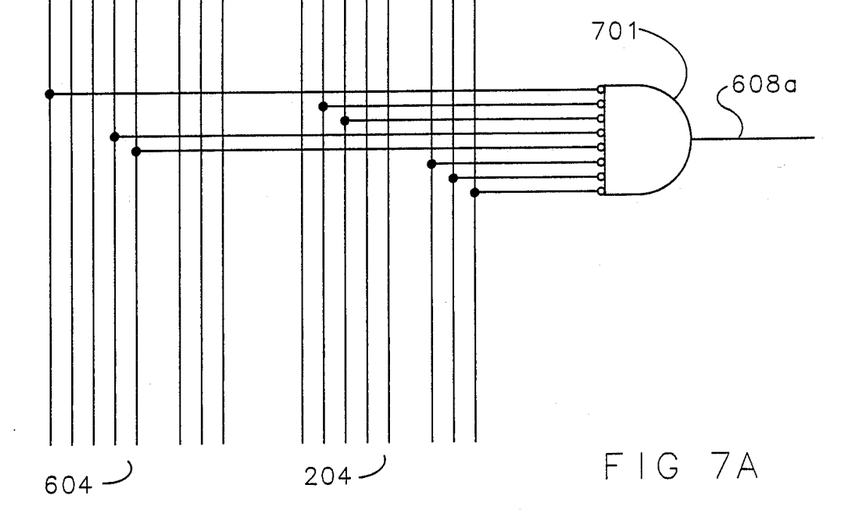
FIGS. 7A and 7B show alternate embodiments of a correcting decoder shown in FIG. 6.

FIG. 7A shows details of the implementation of error correcting decoder 601. Error correcting decoder 601 comprises sixty-four gates of which one is shown in FIG. 7. A gate 701, complements its eight inputs and performs a logic "AND" operation. Gate 701 produces a single flipper control bit 608a. Flipper control bit 608a is one of sixty-four flipper control bits 608. Each of eight inputs of gate 701 is coupled to one of syndrome bits 204 or complemented syndrome bits 604, as shown. A gate similar to gate 701 is used to produce each flipper control bit of flipper control bits 608. Each gate similarly generates a flipper control bit of flipper control bits 608 using inputs from syndrome bits 204 and complemented syndrome bits 604. Which combination of syndrome bits 204 and complemented syndrome bits 604 are utilized to produce each of flipper control bits 608 will be addressed in the discussion of Table 2 shown in FIG. 11.

Figure 7B:
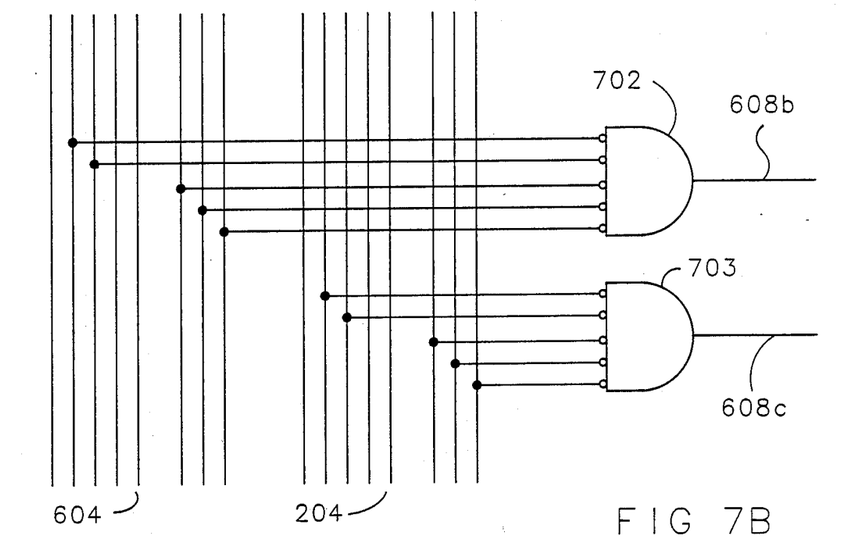

FIG. 7B shows an alternate embodiment. In FIG. 7B a five input gate 702 produces a single flipper control bit 608b. Each error may be uniquely identified from five bits from syndrome bits 204 and/or complemented syndrome bits 604. Therefore error correcting decoder 601 may be implemented using five input gates such as gate 702. Similarly five input gate 703 produces a single flipper control bit 608c.

Figure 8:
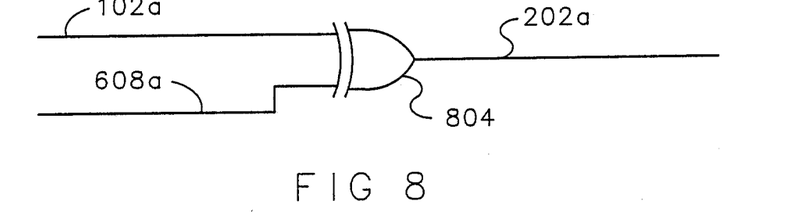
FIG. 8 shows details of an error correcting "Exclusive Or" (XOR) array shown in FIG. 6.

FIG. 8 shows details of the implementation of error correction XOR array 605. Error correction XOR aray 605 comprises sixty-four XOR gates. A single XOR gate 804 is shown in FIG. 8 as an example. XOR gate 804 receives a data bit 102a from data bits 102 and a corresponding flipper control bit 608a from flipper control bits 608. XOR gate 804 produces a corresponding corrected data bit 202a of corrected data bits 202. In this way all sixty four corrected data bits 202 are generated. As has been discussed above, when there are no errors in transmission, each of flipper control bits 608 will be at logic 0, and corrected data bits 202 will be identical to data bits 102. If there is an error in a single bit, the corresponding flipper control bit will be at logic 1, and the data bit in error will be corrected. In the shown embodiment XOR gates have been used. However, with only slight changes XNOR gates may be used instead, and may be preferred in certain cases.

Figure 9A:
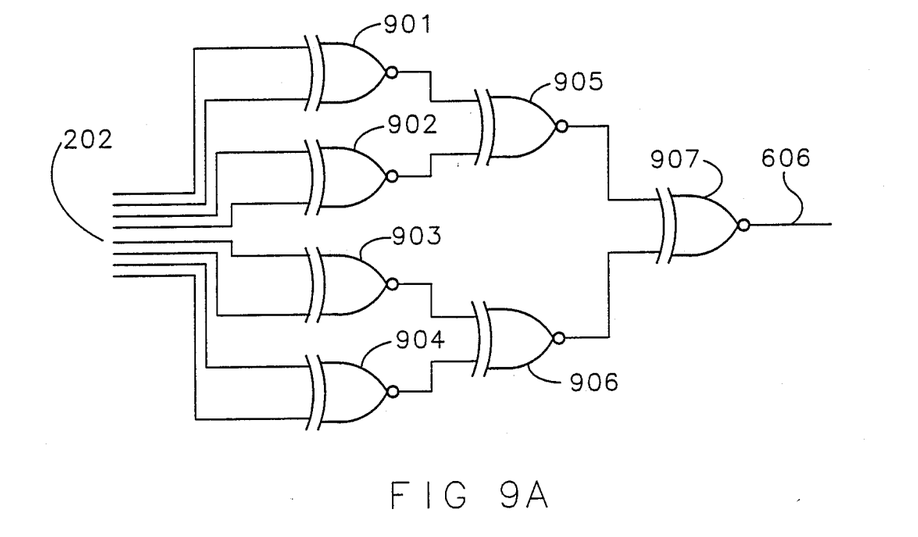
FIGS. 9A and 9B show details of an error detecting block shown in FIG. 6.
Figure 9B:
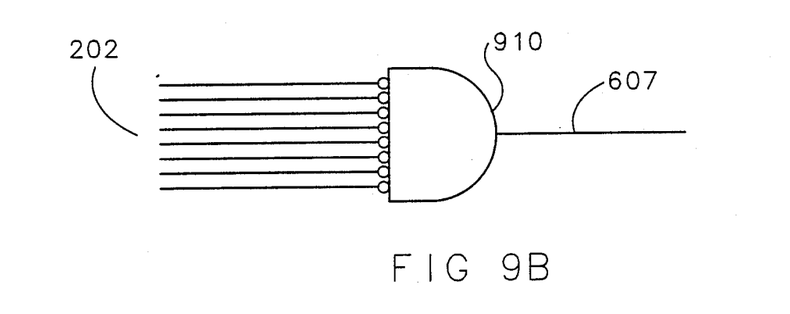

FIG. 9A and FIG. 9B show detail of an error detecting block shown in FIG. 6. In FIG. 9A an array of XNOR gates comprising an XNOR gate 901, an XNOR gate 902, an XNOR gate 903, an XNOR gate 904, an XNOR gate 905, an XNOR gate 906 and an XNOR gate 907 are coupled together to form a binary tree, as shown. Syndrome bits 202 are input to the array of XNOR gates 901-907. The array of XNOR gates 901-907 produces multiple error signal 606. As can be seen, if an odd number of syndrome bits 202 are at logic 1, multiple error signal 606 will be at logic 0. Otherwise multiple error signal 606 will be at logic 1.

If there are no errors in transmission across bus 108, syndrome bits 202 will all be at logic 0. In this case multiple error signal 606 will be at logic 1. If there is an error in a single bit transmitted across bus 108, an odd number of syndrome bits 202 will be at logic 1. In this case multiple error signal 606 will be at logic 0. If there are errors in two bits transmitted across bus 108, an even number of syndrome bits 202 will be at logic 1. In this case multiple error signal 606 will be at logic 1.

In FIG. 9B is shown an eight-input gate 910. Gate 910 complements the value of each of its inputs and then performs a logic AND operation. The operation performed by gate 910 is equivalent to a logic "NOR" operation. Gate 910 produces error signal 607. When all the inputs to gate 910 are at logic 0, error signal 607 will be at logic 1. Otherwise error signal 607 will be at logic 0.

Syndrome bits 202 serve as input to gate 910. If there is no error is transmission across bus 108, syndrome bits 202 will all be at logic 0. In this case error signal 607 will be at logic 1. If one or more errors are detected in a transmission across bus 108, not all of syndrome bits 202 will be at logic 0. In this case error signal 607 will be at logic 0. When error signal 607 is at logic 0, this indicates an error in transmission has been detected.

Figure 10:
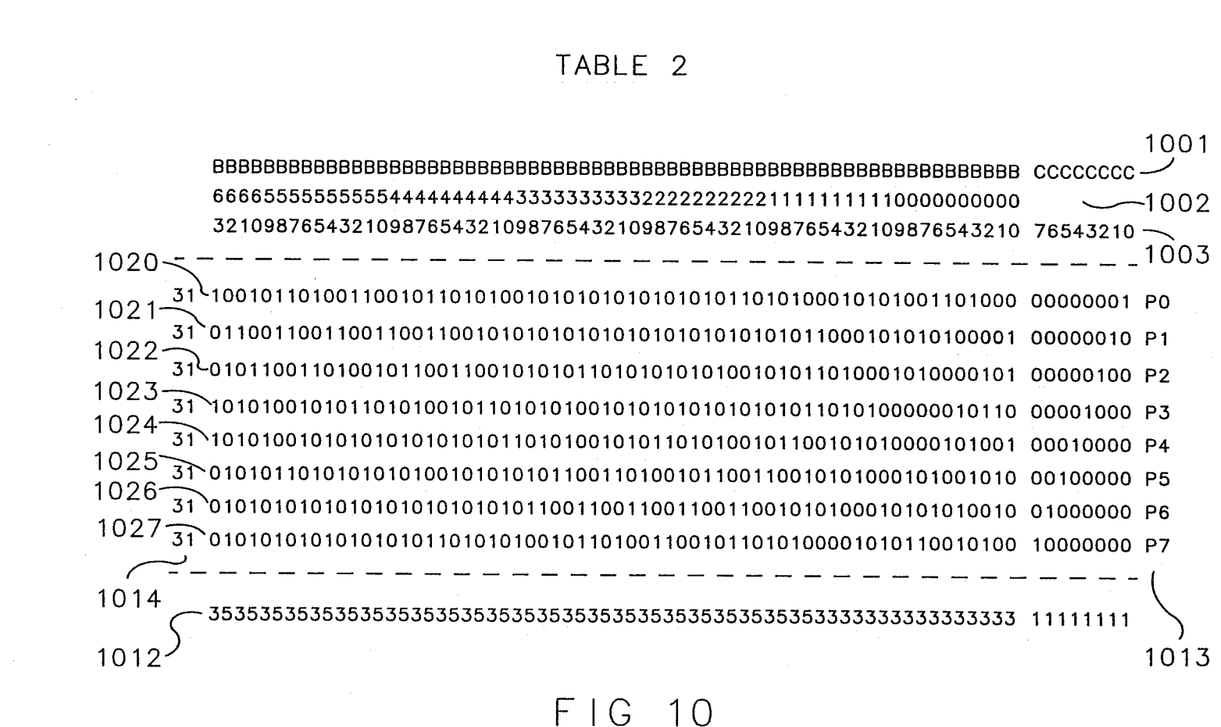
FIG. 10 shows a hammering matrix which illustrates the implementation of an apparatus in accordance with the preferred embodiment of the present invention.

Table 2 in FIG. 10 gives implementation detail concerning the present invention, particularly regarding implementation of XNOR arrays 400-407 within encoding/decoding block 101 and regarding implementation of error correcting decoder 601.

In FIG. 5A and FIG. 5B XNOR arrays 400-407 each receive input from thirty of the sixty-four data bits 102. The following is an explanation of how, for the preferred embodiment, to determine which data bits are input into which XNOR array.

With the exception of columns 1013 and 1014, each column in Table 2 represents a single data bit from data bits 102, or a single parity bit.

Row 1001, at the top of each column, contains letters designating whether each line contains a data bit from data bits 102 or a parity bit. If the letter is a "B", the line contains a data bit from data bits 102. If the letter is a "C", the line contains a parity bit. Row 1002 and Row 1003 identify particular data bits from data bits 102, and identify particular parity bits. In row 1003, the parity bits are numbered from 0 to 7. The parity bits therefore may be referred to using the designations C0–C7. In row 1002 and 1003, data bits 102 are numbered from 0 to 63. Data bits 102 therefore may be referred to using the designations B0–B63.

In column 1013 are shown bits P0, P1, P2, P3, P4, P5, P6, and P7. Bits P0–P7 represent the output of XNOR arrays 400-407 shown in FIGS. 5A and 5B. XNOR array 400 produces bit P0, XNOR array 401 produces bit P1, XNOR array 402 produces bit P2, XNOR array 403 produces bit P3, XNOR array 404 produces bit P4, XNOR array 405 produces bit P5, XNOR array 406 produces bit P6 and XNOR array 407 produces bit P7.

Rows 1020, 1021, 1022, 1023, 1024, 1025, 1026 and 1027 indicate which data bits B0–B63 of data bits 102 are input to which of XNOR arrays 400-407. A "1" in row 1020 indicates a bit is an input to XNOR array 400. A "1" in row 1021 indicates a bit is an input to XNOR array 401. A "1" in row 1022 indicates a bit is an input to XNOR array 402. A "1" in row 1023 indicates a bit is an input to XNOR array 403. A "1" in row 1024 indicates a bit is an input to XNOR array 404. A "1" in row 1025 indicates a bit is an input to XNOR array 405. A "1" in row 1026 indicates a bit is an input to XNOR array 406. A "1" in row 1027 indicates a bit is an input to XNOR array 407. A "0" indicates a data bit is not an input to the XNOR array in the corresponding row. For example, for Table 2, data bit B63 is an input to XNOR array 400, XNOR array 403 and XNOR array 404, but is not an input to XNOR array 401, XNOR array 402, XNOR array 405, XNOR array 406 nor XNOR array 407.

Each XNOR array of XNOR arays 400-407 receives thirty data bits from data bits 102. In addition each XNOR array receives a single parity bit from parity bits C0–C7. The thirty-second input to each of XNOR array 400-407 is at logic 0 except when diagnostics are performed on the system.

When encoder/decoder block 101 is configured as in FIG. 3A and FIG. 5A, bits P0–P7 represent code bits 104. In the preferred embodiment, in this configuration the parity bits are all 0. Therefore, in the configuration shown in FIGS. 3A and 5A, the two non-data inputs in each of XNOR arrays 400-407 are at logic 0.

When encoder/decoder block 101 is configured as in FIG. 3B and FIG. 5B, bits P0–P7 represent syndrome bits 204. The parity bits C0–C7 are code bits 104. Code bits are placed in encoder/decoder block 101 in the same in order in which they are generated when encoder/decoder block 101 is configured as in FIGS. 3A and 5A.

That is, when encoder/decoder block 101 is configured as in FIGS. 3A and 5A, code bits 104 are generated by XNOR arrays 400-407 and referred to as outputs P0–P7. When encoder/decoder block 101 is configured as in FIGS. 3B and 5B, code bits 104 are used as input to encoder/decoder block 101 and referred to as parity bits C0–C7. If a code bit from code bits 104 was labelled P0 when it was generated when encoder/decoder block 101 is configured as in FIG. 3A, then the code bit from code bits 104 is labelled C0 when it serves as input to encoder/decoder block 101 when configured as in FIG. 3B. If a code bit from code bits 104 was labelled P1 when it was generated when encoder/decoder block 101 is configured as in FIG. 3A, then the code bit from code bits 104 is labelled C1 when it serves as input to encoder/decoder block 101 when configured as in FIG. 3B. And so on.

Table 2 may also be used to implement error correcting decoder 601. Table 2 shows which combination of syndrome bits 204 and complemented syndrome bits 604 are utilized to produce each of flipper control bits 608. This may be illustrated by observation of the inputs to gate 701 and the contents of the column under data bit B63. Gate 701 produces the flipper bit for data bit B63. For the "1"s in the column under data bit B63, the corresponding complemented syndrome bit 604 is an input to gate 701. For the "0"s in the column under data bit B63, the corresponding syndrome bit 204 is an input to gate 701.

Similarly, for the five-input system in FIG. 7B, gate 702 produces the flipper bit for data bit B62. The flipper bit for data bit B62 is uniquely identified by the "1"s in the column under data bit B62. Therefore, in order to determine the flipper bit for data bit B62, for every "1" in the column under data bit B62, the corresponding complemented syndrome bit of syndrome bits 604 is an input to gate 702.

Column 1014 shows the total number data bits 102 and parity bits P0–P7 used as input into each XNOR arrays of XNOR arrays 400-407. Each of XNOR arrays 400-407 receives a total of 31 data and parity bits. This may be compared to the contents of row 14 in Table 1 of FIG. 1. As can be seen the present invention gives a notable improvement. The maximum inputs for the present invention is less than have the maximum input of the prior art. The present invention, therefore can be implemented with two fewer levels of logic.

Row 1012 shows how many times each parity bit C0–C7 and each data bit from data bits 102 is used as an input into an XNOR array from XNOR arrays 400–407. Each data bit from data bits 102 is used either three or five times. Each code bit is used only once. This is an improvement over the information in Row 12 in Table 1 of FIG. 1, where a single data bit is used up to seven times. This is because each input of XNOR array 400–407 has a certain amount of capacitance that must be overcome. The more XNOR arrays from XNOR arrays 401–407 for which a single code bit or a single parity bit is used as input the greater total amount of input capacitance needs to be overcome. In the prior art, the greatest number was seven. The present invention, therefore is an improvement.

In order to avoid "glitches" in the system, slowing performance, "dummy loads" may be added to balance the input. Thus if a data bit is used as input to three of XNOR arrays 401–407, two "dummy loads" may be added to simulate the load as if the data bit was used by five of XNOR arrays 401–407. Similarly, each parity bit is used only once, so four dummy loads could be added to each. Of course no dummy loads should be added to data bits which already serve as input to five XNOR arrays from XNOR arrays 401–407.

The information in Table 2 was generated using the following constraints. In order to facilitate the production of tables similar to Table 2, it is helpful to utilize a computer in the selection of table entries in conformance with the following constraints.

Constraint 1

Each of XNOR arrays 400–407 receives a single parity bit

Constraint 2

Each data bit from data bits 102 is used as input for a unique combination of either three or five XNOR arrays from XNOR arrays 400 407.

Constraint 3

Each XNOR array from XNOR arrays 400–407 receives a unique combination of 30 data bits from data bits 102 as input.

Constraint 4

Data bits 102 are divided into pairs, e.g., B00 and B01 are a pair, B02 and B03 are a pair, etc. Only one data bit from each pair enters a particular XNOR array from XNOR arrays 400–407.

Constraint 1 assures that encoder/decoder block 101 can be used both for encoding and decoding. Constraint 2 assures that overall parity is preserved. Constraint 3 in combination with Constraint 2 assures that each syndrome bit has a signature. Therefore, if there is a single bit error it is possible to correct the error. Constraint 4 makes routing easier. This helps in the actual implementation allowing this Encoding/Decoding block 101 to be handwired programmable like a read only memory (ROM).

I claim:

1. An apparatus for assuring the integrity of a plurality of data bits when the plurality of data bits has been transmitted accompanied with a plurality of parity bits, the apparatus comprising:
   syndrome generation means for generating a plurality of syndrome bits, the syndrome generation means divided into a plurality of arrays each aray producing a single syndrome bit of the plurality of syndrome bits, each array receiving asubset of the plurality of data bits, and each array receiving a single parity bit so that only one parity bit is used in the generation of each syndrome bit; and,
   error correction and detection means, coupled to the syndrome generation means, for receiving the plurality of data bits and the plurality of syndrome bits, for correcting an error in the plurality of data bits when there is an error in the transmission of a single bit from the plurality of data bits and for detecting when there has been an error in the transmission of two bits from the plurality of data bits the error correction and detection means including
   a plurality of combination means, each combination means for generating a flipper bit for a single data bit from the plurality of data bits;
   wherein when a first data bit for which a first flipper bit is being generated is used in the production of a majority of syndrome bits, a first combination means which generates the first flipper bit receives as input only syndrome bits for the production of which the first data bit was used and when a second data bit for which a second flipper bit is being generated was not used in the production of a majority of syndrome bits, a second combination means which generates the second flipper bit receives as input only syndrome bits for the production of which the second data bit was not used.

2. An apparatus as in claim 1, wherein each array of the plurality of arrays receives the same number of data bits from the plurality of data bits, but receives a different combination of data bits from the plurality of data bits.

3. An apparatus for insuring the integrity of transmission of data, the apparatus comprising:
   encoding/decoding means for receiving a plurality of data bits and a first plurality of parity bits, and for producing a second plurality of parity bits, the encoding/decoding means divided into a plurality of arrays each array receiving one and only one parity bit from the first plurality of parity bits, each array receiving data bits from the plurality of data bits, and each array producing one and only one of the parity bits of the second plurality of parity bits;
   wherein when the encoding/decoding means is encoding, the first plurality of parity bits are all at logic 0 and the second plurality of parity bits are code bits, and wherein when the encoding/decoding means is decoding, the first plurality of parity bits are code bits and the second plurality of parity bits are syndrome bits;
   transmission means, coupled to the encoding/decoding means, for transmitting the plurality of data bits and the second plurality of parity bits when encoding/decoding means is encoding and the second plurality of parity bits are code bits;
   error correction means, coupled to the encoding/decoding means, for when the encoding/decoding means is decoding, receiving the plurality of data bits and the plurality of syndrome bits, and for correcting an error in the first plurality of data bits when there is an error in the transmission of a single bit from the first plurality of data bits, the error correction means including a plurality of combination means, each combination means for generating a flipper bit for a single data bit from the plurality of data bits;

wherein when a first data bit for which a first flipper bit is being generated is used in the production of a majority of syndrome bits, a first combination means which generates the first flipper bit receives as input only syndrome bits for the production of which the first data bit was used and when a second data bit for which a second flipper bit is being generated was not used in the production of a majority of syndrome bits, a second combination means which generates the second flipper bit receives as input only syndrome bits for the production of which the second data bit was not used.

4. An apparatus as in claim 3, wherein each array of the plurality of arrays receives the same number of data bits from the plurality of data bits, but receives a different combination of data bits from the plurality of data bits.

5. An apparatus as in claim 3 wherein the first combination means comprises a device which performs a logic NOR operation and which receives as input the complements of each of the syndrome bits for the production of which the first data bit was used and wherein the second combination means comprises a device which performs a logic NOR operation and which receives as input each of the syndrome bits for the production of which the second data bit was not used.

6. In an apparatus which provides for the correction of a single error in a plurality of data bits when the plurality of data bits has been transmitted accompanied with a plurality of parity bits, a method for correcting an error in the transmission of a single bit, the method comprising the following steps:

(a) generating a plurality of syndrome bits each syndrome bit being generated using a subset of the plurality of data bits and a single parity bit; and, (b) detecting, with the use of the syndrome bits, whether an error in a single bit occurred, and if so performing the following substeps:

(b1) for each data bit in the plurality of data bits, if the data bit was used in the generation of a majority of syndrome bits, utilizing the syndrome bits for the generation of which the data bit was used, and no other syndrome bits, in order to detect whether that data bit was the data bit in which the error occurred;

(b2) for each data bit in the plurality of data bits, if the data bit was not used in the generation of a majority of syndrome bits, utilizing the syndrome bits for the generation of which the data bit was not used, and no other syndrome bits, in order to detect whether that data bit was the data bit in which the error occurred; and, (b3) correcting the data bit in which the error occurred.

* * * * *